(12) United States Patent
Ryan (10) Patent No.: US 7,117,299 B2
(45) Date of Patent: *Oct. 3, 2006

(54) DRAM WITH HIDDEN REFRESH

(75) Inventor: Kevin J. Ryan, Eagle, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/151,705

(22) Filed: Jun. 14, 2005

(65) Prior Publication Data

US 2006/0013054 A1    Jan. 19, 2006

Related U.S. Application Data

(63) Continuation of application No. 09/641,519, filed on Aug. 21, 2000, now Pat. No. 6,941,415.

(51) Int. Cl.
*G06F 12/00* (2006.01)

(52) U.S. Cl. .................. 711/106; 711/167; 711/168

(58) Field of Classification Search ................ 711/105, 711/106, 167, 168; 365/222, 189.01
See application file for complete search history.

(56) References Cited

U.S. PATENT DOCUMENTS

| 4,172,282 A | 10/1979 | Aichelmann et al. |
| 4,601,018 A | 7/1986 | Baum et al. |
| 4,807,289 A | 2/1989 | Nakajima |
| 4,849,936 A | 7/1989 | Mizutani |
| 5,638,529 A | 6/1997 | Yee et al. |
| 5,651,131 A | 7/1997 | Chesley |
| 5,802,555 A | 9/1998 | Shigeeda |
| RE36,180 E | 4/1999 | Lim |
| 5,959,923 A | 9/1999 | Matteson et al. |
| 5,999,474 A | 12/1999 | Leung et al. |
| 6,028,804 A | 2/2000 | Leung |
| 6,167,484 A | 12/2000 | Boyer et al. |
| 6,415,353 B1 | 7/2002 | Leung |
| 6,504,780 B1 | 1/2003 | Leung |

OTHER PUBLICATIONS

Yamauchi, et al. "A circuit Technology for a Self-Refresh 16Mb DRAM with Less than 0.5 uA/MB Data-REtention Current", © 1995 IEEE< p. 1174-1182.*

Sakurai, et al., "Transparent-Refresh DRAM (TReD) Using Dual-Port DRAM Cell", © 1988 IEEE, p. 4.3.1-4.3.4.*

"MoSys Explains 1T-SRAM Technology," by Peter N. Glaskowsky, Microprocessor Report, vol. 13, No. 12, Sep. 13, 1999.

* cited by examiner

*Primary Examiner*—Brian R. Peugh
(74) *Attorney, Agent, or Firm*—Dickstein Shapiro LLP (57) ABSTRACT

A synchronous DRAM is provided having specified time slots (e.g., every multiple of 4 clock pulses of a DRAM input clock) within which read or write commands may be entered on the command/address bus. During operation, the DRAM performs internally generated refresh operations on a periodic basis while avoiding collisions with controller-generated data accesses. An internal refresh cycle can be executed without interfering with any data accesses by starting the refresh after decoding a non-conflicting command in one of these time slots and finishing before the next command time slot. If an internal refresh operation is delayed (e.g., by the decoding of a conflicting access command) it will be completed at the earliest opportunity thereafter.

28 Claims, 7 Drawing Sheets

DRAM WITH HIDDEN REFRESH

This application is a continuation of application Ser. No. 09/641,519, filed Aug. 21, 2000, now U.S. Pat. No. 6,941,415, the entire disclosure of which is incorporated herein.

BACKGROUND OF THE INVENTION

1. Field of the Invention

The present invention relates to the field of integrated circuits. More particularly, it relates to a dynamic random access memory (DRAM) refresh operation that does not depend upon a certain number of read accesses and that also does not interfere with data accesses initiated by the controller.

2. Description of the Related Art

In a dynamic random access memory ("DRAM"), data is stored as a logic one or zero by the presence or absence of charge on a capacitor within an individual memory cell. After the data has been stored as charge on the capacitor, the charge gradually leaks off and the data is corrupted. The time within which a refresh must be performed lest the data might be in danger of being lost is commonly referred to as the refresh interval. Therefore, a "refresh" cycle must be performed to maintain the integrity of the data. To refresh data in a memory array, the array is typically placed in a read mode to obtain the present data stored in a row of memory cells. Subsequently, this data is used as new input data that is re-written into the row of memory cells, thus maintaining the stored data. An important aspect of the refresh cycle of prior art DRAMs is that no other operation involving a different row in the array can occur simultaneously during the refresh operation.

Figure 1:
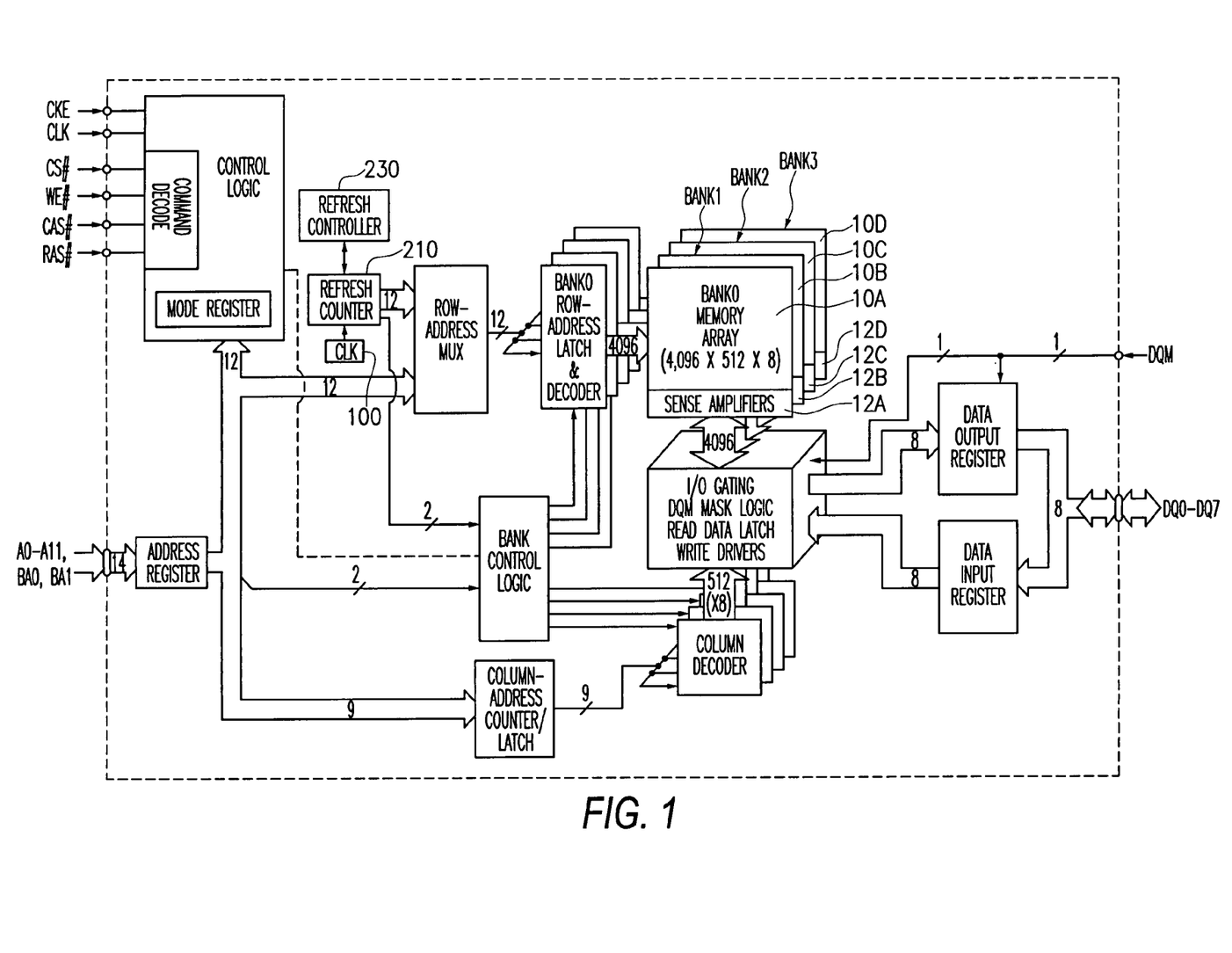
FIG. 1 illustrates a block diagram of an exemplary prior art DRAM.

A functional block diagram of a typical 64M SDRAM is shown in FIG. 1. Since SDRAM operation is well known in the art, only a brief description of the FIG. 1 DRAM will be provided herein. The FIG. 1 SDRAM is a quad-bank ("x16") SDRAM having four 16, 777, 216-bit banks 10A–10D organized as 4,096 rows by 256 columns by 16 bits. Circuit blocks 12A–12D include sense amplifiers coupled to each column within the memory array to transform charge on the capacitor in the memory cell into a valid logic one or zero. Read and write accesses to the SDRAM are burst oriented; accesses start at a selected location and continue for a programmed number of locations in a programmed sequence. Address bits registered coincident with an ACTIVE command are used to select the bank and row to be accessed. The address bits registered coincident with the READ or WRITE command are used to select the starting column location for the burst access.

In the DRAM of FIG. 1, two types of refresh cycles are available; auto refresh and self-refresh. The self-refresh cycle automatically and internally refreshes the data sequentially in the memory arrays. The auto refresh cycle is analogous to CAS#-BEFORE-RAS# (CBR) REFRESH in conventional DRAMs. Providing a distributed AUTO REFRESH command every 15.625 µs will meet the refresh requirement and ensure that each row is refreshed. The SELF REFRESH command can be used to retain data in the SDRAM even if the rest of the system is powered down. Once self refresh mode is engaged, the SDRAM provides its own internal clocking, causing it to perform its own AUTO REFRESH cycles.

One problem associated with such refresh cycles is that a given refresh cycle may conflict with a controller-generated access command (e.g., a read or write command). Many DRAM's are configured for deterministic latency which means that an access can never lose priority; and therefore, the refresh operation must wait (e.g., put into a queue) until the access has been completed. The danger with such a practice, of course, is that a refresh operation may be postponed for a period of time greater than a predetermined refresh interval, thus placing the data at risk.

One approach to solving this problem has been proposed by Monolithic System Technology, Inc. with its 1T-SRAM technology. Under the 1T-SRAM approach, refresh operations are triggered by read commands. One problem with relying upon read commands to trigger a refresh operation is that it can result in refresh overkill. That is, a read command may be received from the system processor more frequently than a refresh is actually required, thus, wasting valuable power resources. Another problem with relying upon read commands is that if the memory is idle for greater than the refresh interval (e.g., 64 ms), data will be lost.

Yet another approach to the problem proposes to trigger a refresh operation off of a clock pulse (e.g., after a predetermined number of clock pulses, a refresh operation is triggered). However, under this approach, there is no way to guarantee that the refresh will not begin just before a read command. In such a case, if the read access is delayed until the refresh operation is completed, the overall time required to access memory is increased.

Another approach to the refresh problem is disclosed in U.S. Pat. No. 6,028,804 (the "'804 patent"). The '804 patent discloses a method of operating a memory array which contains memory cells requiring periodic refresh in which a refresh is performed only if no external access is determined to be pending. An accumulator is disclosed for accumulating (i.e., delaying) refresh requests that conflict with an external access for up to seven refresh requests (or 56 µs).

According to the '804 patent, external memory accesses are allowed to continue for a period of up to 56 µs without losing refresh cycles. The '804 patent states that back-to-back external accesses longer than 56 µs generally do not occur. The '804 patent also states that the memory cycle of its disclosed memory system is equal to one clock cycle. Thus, the '804 patent does not consider the special complex problems associated with having a memory cycle that is equal to multiple clock cycles, such as e.g., the fact that access commands must be disallowed for certain clock cycles. In addition, the '804 patent does not provide for simultaneous operations (e.g., read, write or refresh). Thus, there exists a need for a hidden DRAM refresh operation that does not depend upon a certain number of read accesses, that does not interfere with data accesses initiated by the controller, that allows for simultaneous operations and that is consistent with today's memory cycles which may last for multiple clock cycles.

SUMMARY OF THE INVENTION

The present invention overcomes the problems associated with the prior art and provides a system and method for performing a hidden DRAM refresh operation that does not depend upon a certain number of read accesses and that also does not interfere with data accesses initiated by the controller. In accordance with an exemplary embodiment of the invention, a synchronous DRAM is provided having specified time slots (e.g., every multiple of 4 clock pulses) for entering read or write commands. In addition, a self-refresh counter and controller are provided and which are driven by the DRAM input clock. During operation, the DRAM performs internally generated refresh operations on a periodic basis while avoiding collisions with controller-generated data accesses. Specifically, the command and address bus contains predetermined time slots (e.g., every fourth positive edge of the DRAM input clock after the first read or write command is entered) within which the controller is allowed to apply data access commands (e.g., read, write). An internal refresh cycle can be executed without interfering with any data accesses by starting the refresh after decoding a non-conflicting command in one of these time slots and finishing before the next command time slot. If an internal refresh operation is delayed (e.g., by the decoding of a conflicting access command) it will be completed at the earliest opportunity thereafter. In accordance with an exemplary embodiment of the invention, NOP's (no operation's), accesses to other memory arrays (also referred to as banks), and accesses to an accompanying static random access memory (SRAM) cache are all examples of non-conflicting commands and all provide such an opportunity to complete the refresh operation. In worst case scenarios, it is the SRAM cache that ensures that an opportunity to refresh will occur within the allotted refresh interval.

BRIEF DESCRIPTION OF THE DRAWINGS

The foregoing and other advantages and features of the invention will become more apparent from the detailed description of preferred embodiments of the invention given below with reference to the accompanying drawings in which.

DETAILED DESCRIPTION OF PREFERRED EMBODIMENTS

The present invention will be described as set forth in an exemplary embodiment illustrated in FIGS. 2–7. Other embodiments may be utilized and structural or logical changes may be made without departing from the spirit or scope of the present invention.

Figure 2:
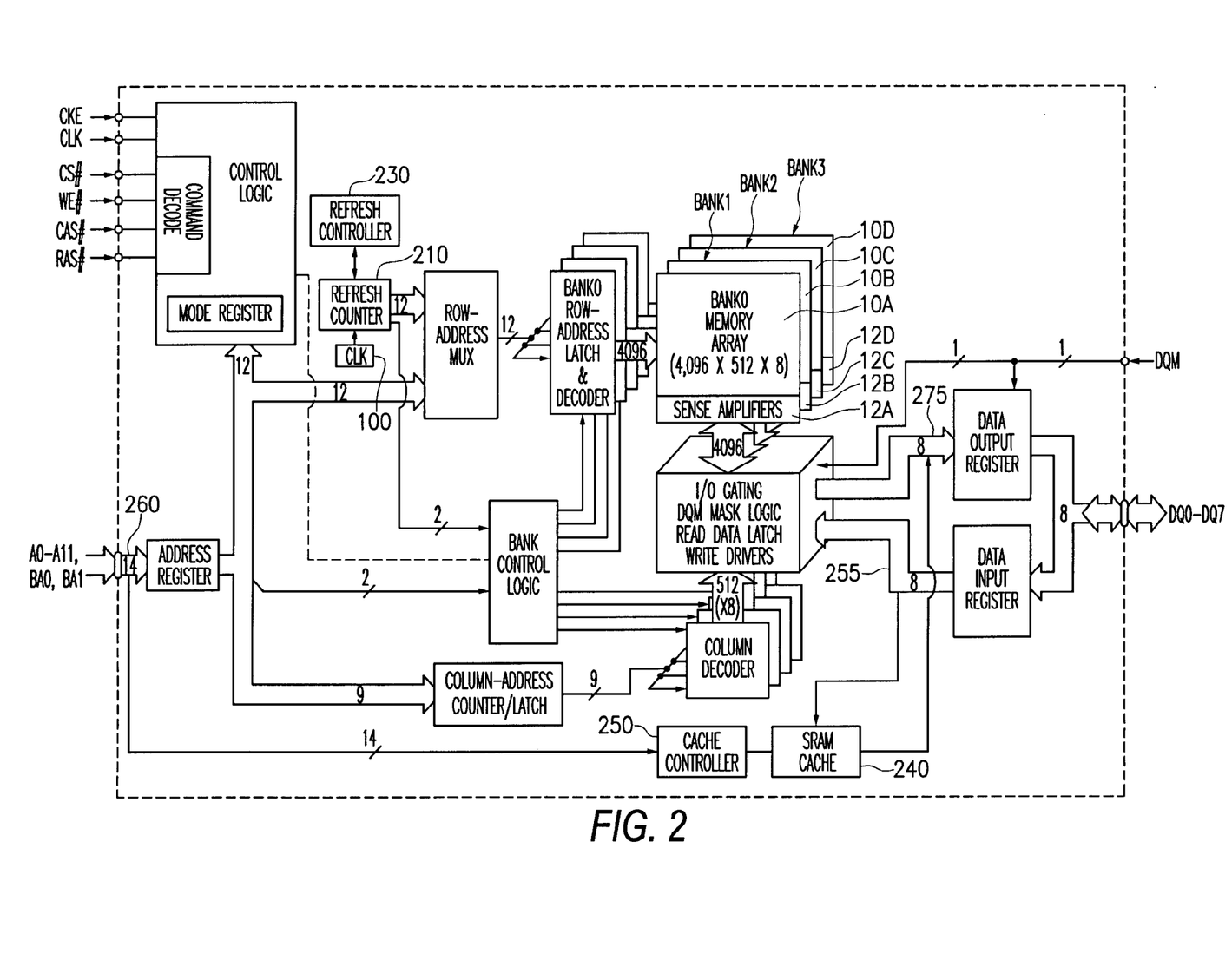
FIG. 2 illustrates a simplified block diagram of a DRAM refresh system in accordance with an exemplary embodiment of the invention.

Referring to FIG. 2, a block diagram of a DRAM having a hidden refresh system is depicted in accordance with an exemplary embodiment of the invention. The structure of the FIG. 2 DRAM is essentially the same as that of the FIG. 1 DRAM except that the FIG. 2 DRAM contains a SRAM cache 240, a cache controller 250 and a refresh controller 230. The address bus 260 is coupled to the cache controller 250 for receiving all 14 bits of the address. The cache controller 250 is coupled to the SRAM cache 240 for controlling the SRAM cache 240. An input of the SRAM cache 240 is coupled to bus 255 and an output of the SRAM cache 240 is coupled to bus 275. The operation of the FIG. 2 diagram will be described in connection with the flowchart of FIG. 3.

Figure 3:
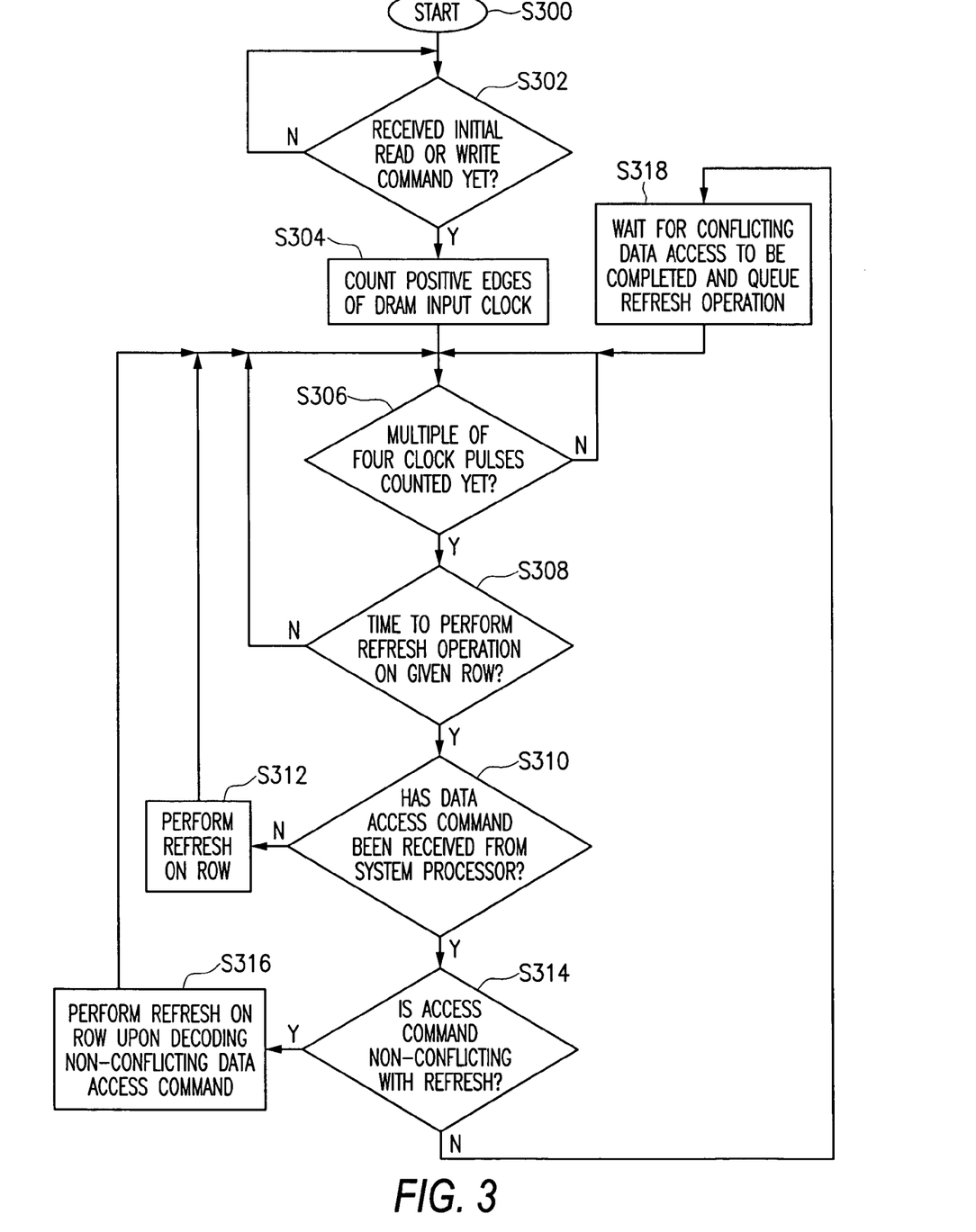
FIG. 3 illustrates a flowchart depicting a functional flow of the FIG. 2 system, in accordance with an exemplary embodiment of the invention.

Turning to FIG. 3, a flowchart is illustrated and depicts an exemplary functional flow of the system described above in connection with FIG. 2. The operation begins at step S300 and at step S302, the refresh controller 230 determines whether an initial Read or Write command has been received over the command/address bus 260. If not, step S302 is repeated until an initial command has been received. At step S304, the self-refresh counter 210 counts positive clock edges of the DRAM input clock 100 which, for example, may be running at 300 MHz.

At step S306, the refresh controller 230 determines whether four clock pulses have been counted since the initial command has been received. If not, step S306 is repeated. At step S308, the refresh controller 230 determines whether it's time to perform a refresh operation on a given row of memory cells with a particular memory array 10A–10D.

For example, assuming a 64M synchronous DRAM with 4 internal banks of 4096 rows each, and for each refresh operation, one row in each bank is refreshed. That is, there are 16,384 total rows in the device and 4 rows are refreshed at a time, meaning 4096 refresh operations are needed to refresh all memory cells. Each memory cell must be refreshed at least once every 64 ms, therefore, one refresh operation should be performed every 15.625 µs (i.e., 4096× 15.625 µs=64 ms). The self-refresh counter 210 counts the number of input clock pulses corresponding to 15.625 µs and generates an internal interrupt indicating that it is time to perform a refresh operation. It is also possible to simultaneously refresh one row in each of a plurality of sub-arrays in a bank containing sub-arrays, while leaving the other banks available for memory access, and cycle the refresh operation among all available memory banks.

If the refresh controller 230 has determined it is not yet time to perform a refresh, step S306 is repeated. If it is determined that it is time to perform a refresh operation, the refresh controller 230 determines whether the DRAM has received a data access command from the system processor at step S310. If not, the refresh operation is performed at step S312 and the process returns to the input of portion S306. The actual refreshing of the memory cells may be carried out in any number of ways known in the art including, but not limited to, those methods described in U.S. Pat. No. Re. 36,180 assigned to Micron Technology, the contents of which are fully incorporated herein by reference. Therefore, a specific process for actually carrying out the refresh operation in connection with the present invention will not be described herein.

If at step S310, the refresh controller 230 determines that a data access command has been received from the system processor, the refresh controller 230 determines whether the access command does not conflict with the refresh operation at step S314. The refresh controller 230 is configured to continually run a predetermined refresh address sequence, the exact configuration of which is not critical for purposes of explaining the present invention. The present invention determines, among other things, whether the refresh operation, scheduled to be performed on a particular row at a predetermined time, will conflict with a data access command received on the command/address bus 260.

If at step S314, it is determined that the data access command is non-conflicting with the refresh operation, then upon decoding the non-conflicting data access command, the refresh controller 230 sees that the refresh operation is carried out on the particular row at portion S316 and the process returns to the input of portion S306. In accordance with a preferred embodiment of the invention, the refresh operation is completed between the time the non-conflicting data access command is decoded and the next four clock pulses are counted from the DRAM input clock 220 (i.e., the refresh operation is completed before the next data access command is allowed to be received on the command/address bus 260).

If at step S314 it is determined that the data access command is not non-conflicting (i.e., is conflicting) with a scheduled refresh operation, then, at step S318, the refresh controller 230 is configured to wait for the conflicting data access command to be completed and postpones (i.e., queues) the refresh operation until a next available opportunity, as will be explained more fully below.

As depicted in the FIG. 3 flowchart, the method is a continuous loop. The SRAM cache 240 is configured such that the refresh interval would never be violated. The cache 240 size equals the size of one sub-array (e.g., 10A of FIG. 2; however, it should be noted that one sub-array may or may not equate to one logical bank) and the refresh interval is set such that the time required to fill the cache 240 with the data from the sub-array 10A is less than the refresh interval. Therefore, even for the worst case scenario where every portion of the sub-array 10A was accessed once before any one portion was accessed a second time (i.e., where such an access would actually perform the refresh operation) a second refresh request would still not have arrived yet. That is, the first queued up request would be executed.

In accordance with an exemplary embodiment of the invention, the data included within the row to be accessed is written into the SRAM cache 240 where it may be accessed by the system processor for a desired read or write operation. In the meantime, data in other rows of the same sub-array is refreshed before the refresh interval is reached.

For example, a worst case scenario would be a continued series of read/write commands applied on every $4^{th}$ clock pulse for a long time (i.e., several times greater than the refresh interval), whereby the read/write commands are continually received by the same bank. Assuming there are e.g., four banks (e.g., 10A–10D), then during the continuing accesses to the same bank (e.g., 10A), all the refresh operations could be directed to the other three banks (e.g., 10A–10C) and eventually the data in the bank being accessed will be lost (i.e., the stored charge will leak off the capacitors). It should be noted, however, that the act of accessing rows in the one bank (e.g., 10A) will refresh those rows, so the problem is when one bank is continually accessed, but not all rows within the bank. In such a case, the non-accessed rows in the bank being continually accessed (10A) will eventually be lost. This is where the SRAM cache 240 is effective. Accessing one bank continually for a long period of time means that you must access some row/column combination in that bank multiple times. With the SRAM cache 240, in accordance with the exemplary embodiment of the invention, those multiple accesses will be serviced by the SRAM cache 240, thereby freeing up the non-accessed rows in the continually accessed bank (10A) in order to perform a much needed refresh.

Figure 4:
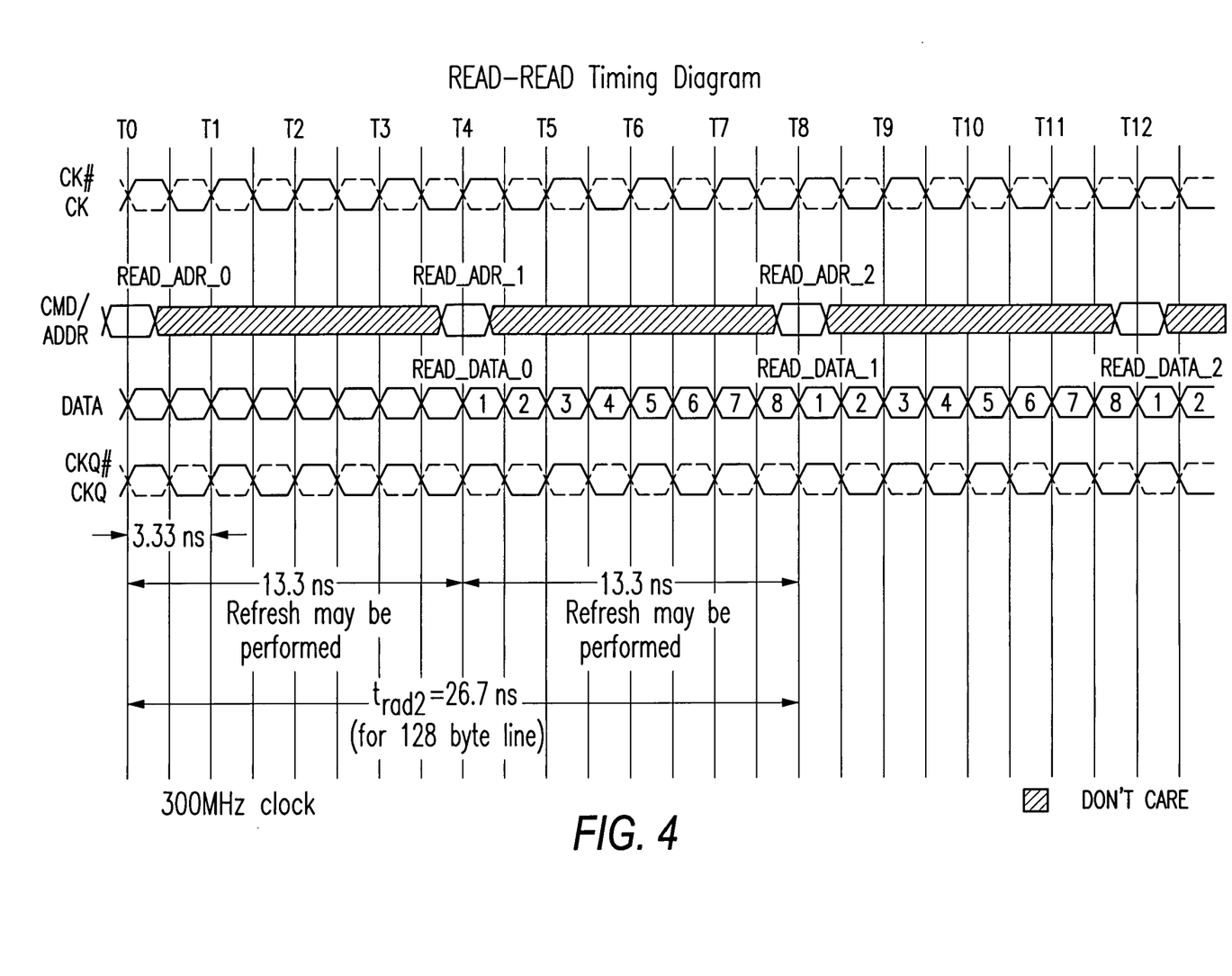
FIG. 4 illustrates a READ-READ timing diagram for the FIG. 2 system, in accordance with an exemplary embodiment of the invention.

Turning to FIG. 4, a Read-Read timing diagram is depicted in accordance with the exemplary embodiment of the invention. Thirteen clock pulses of a DRAM input clock are depicted as $T_0$–$T_{12}$. At each multiple of four clock pulses, a read and/or write command is allowed to be placed on the command/address bus 260 (of FIG. 2). FIG. 4 depicts a read command located at clock pulses $T_0$, $T_4$ and $T_8$. In accordance with the exemplary embodiment of the invention, the refresh operation may be performed between T0 and T4 and also between T4 and T8 and so on.

Figure 5:
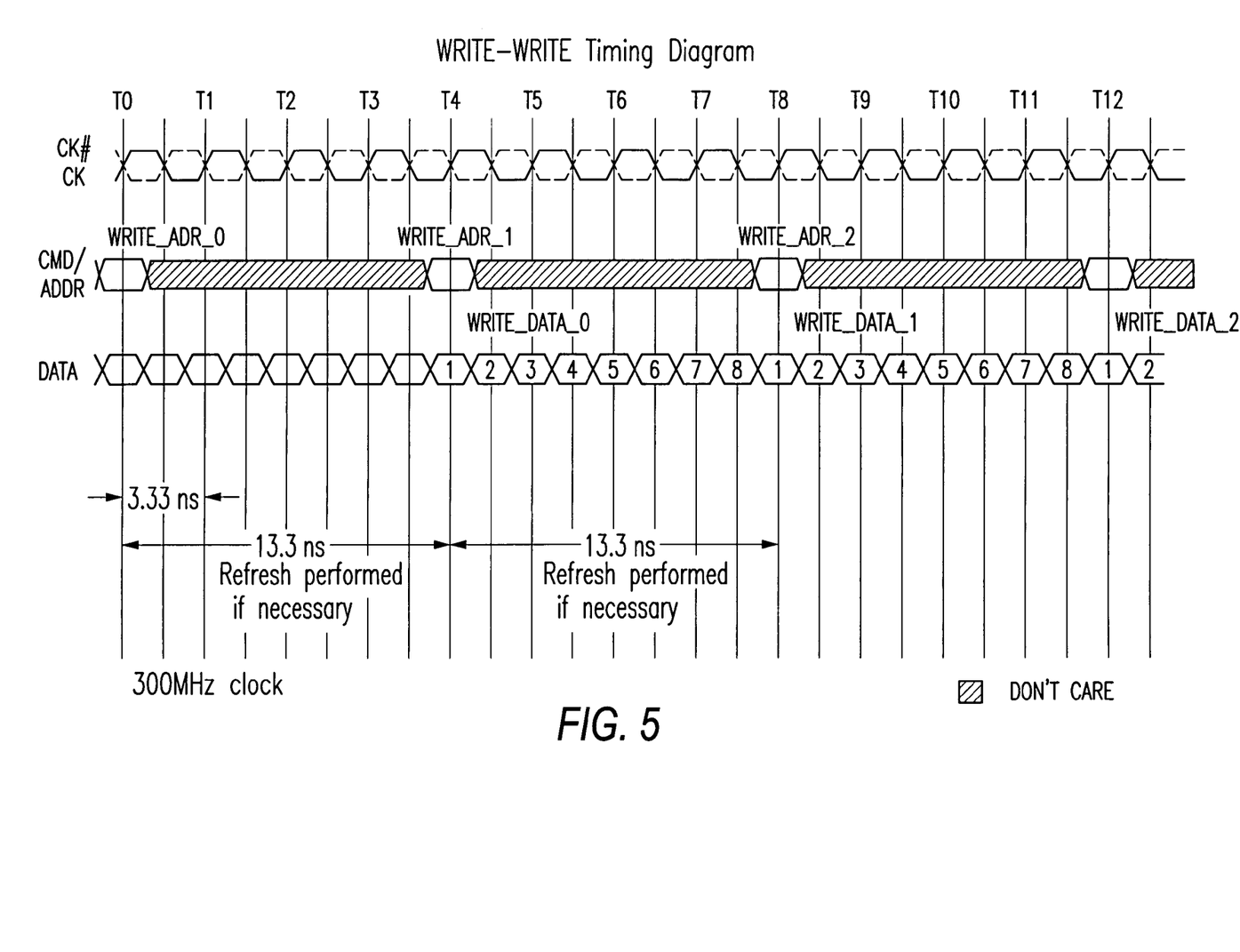
FIG. 5 illustrates a WRITE-WRITE timing diagram for the FIG. 2 system in accordance with an exemplary embodiment of the invention.

Turning to FIG. 5, a Write-Write timing diagram is depicted in accordance with the exemplary embodiment of the invention. Thirteen clock pulses of a DRAM input clock are depicted as $T_0$–$T_{12}$. At each multiple of four clock pulses, a read and/or write command is allowed to be placed on the command/address bus 260 (of FIG. 2). FIG. 5 depicts a write command located at clock pulses $T_0$, $T_4$ and $T_8$. In accordance with the exemplary embodiment of the invention, the refresh operation may be performed between T0 and T4 and also between T4 and T8 and so on.

Figure 6:
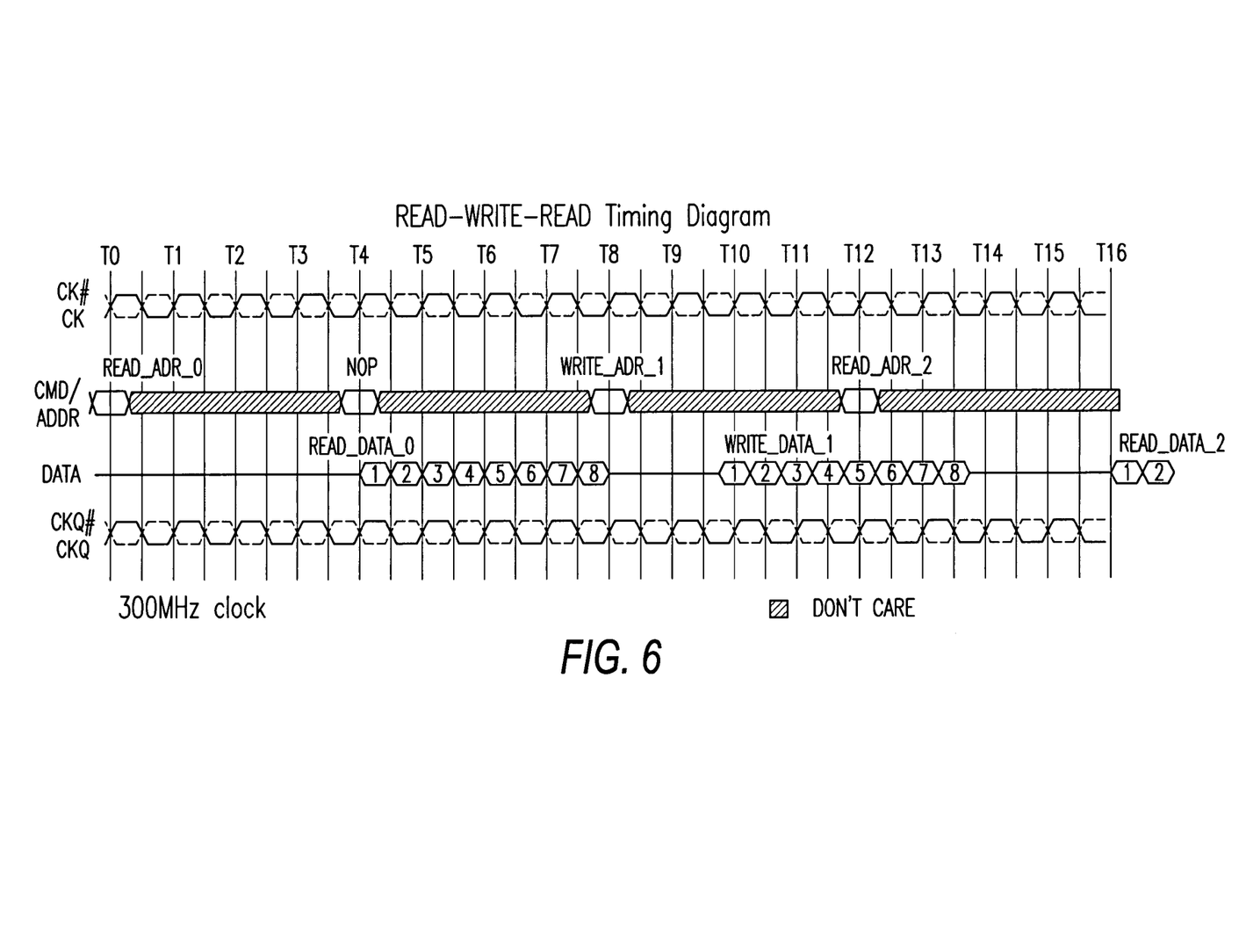
FIG. 6 illustrates a READ-WRITE-READ timing diagram for the FIG. 2 system, in accordance with an exemplary embodiment of the invention.

FIG. 6 depicts a Read-Write-Read timing diagram, in accordance with the exemplary embodiment of the invention. Seventeen clock pulses of a DRAM input clock are depicted as $T_0$–$T_{16}$. At each multiple of four clock pulses, a read and/or write command is allowed to be placed on the command/address bus 260 (of FIG. 2). FIG. 6 depicts a read command located at clock pulses $T_0$ and $T_{12}$. In addition, FIG. 6 depicts a write command located at clock pulse $T_8$. In accordance with the exemplary embodiment of the invention, the refresh operation may be performed between $T_0$ and $T_4$ and also between $T_4$ and $T_8$ and so on. It should be noted that $T_4$ contains a NOP which can trigger a refresh operation if one is needed at that time; and, of course, the NOP will not conflict with the refresh operation.

Figure 7:
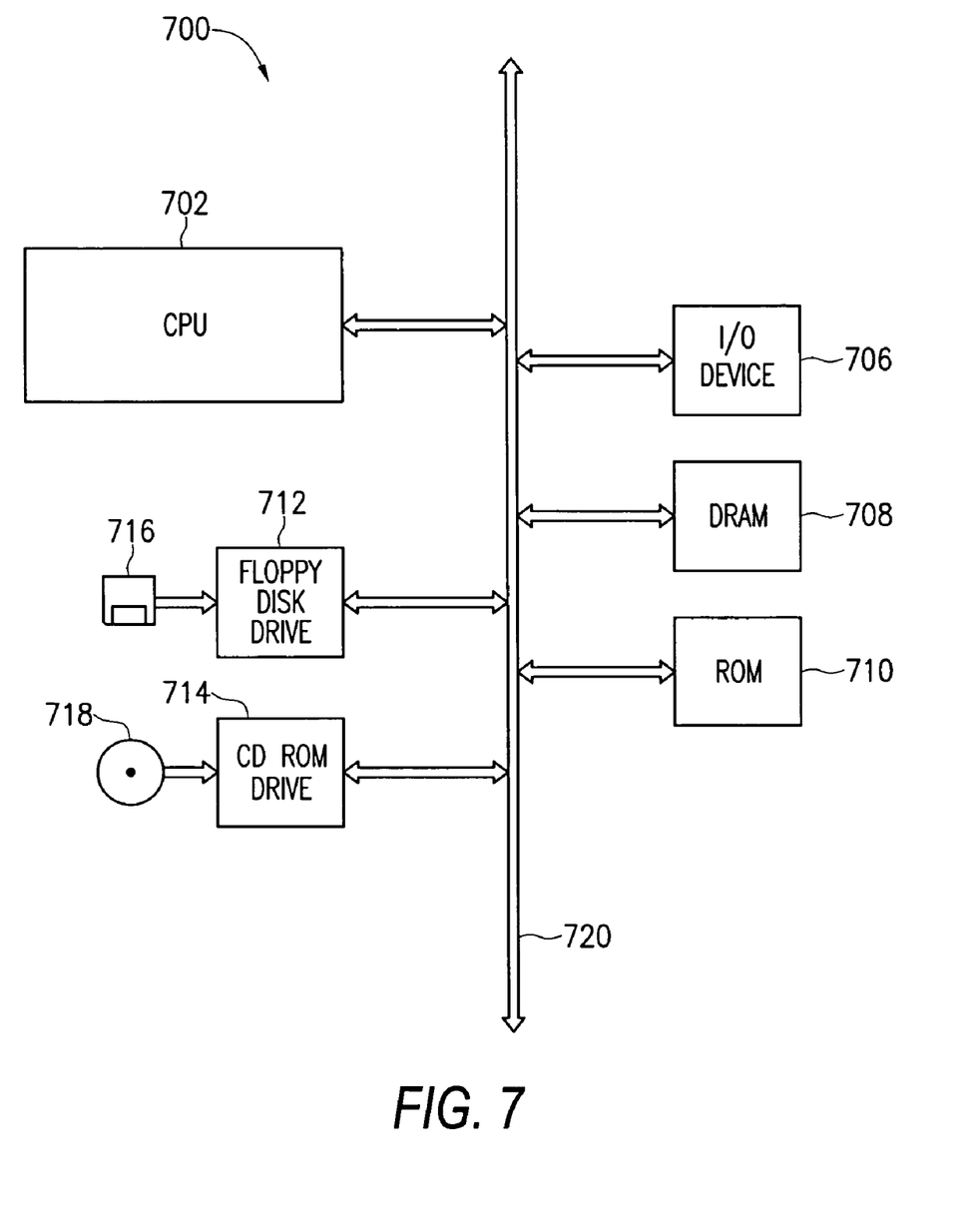
FIG. 7 illustrates a block diagram of a processor-based system incorporating a DRAM refresh system in accordance with an exemplary embodiment of the invention.

FIG. 7 illustrates a block diagram of a processor-based system 700 utilizing a DRAM 308 having a refresh system constructed in accordance with the present invention. That is, the DRAM 708 may be the DRAM illustrated in FIG. 2 and operates as described above with respect to FIGS. 3 to 6. The processor-based system 700 may be a computer system or any other system requiring a DRAM. The system 700 includes a central processing unit (CPU) 702, e.g., a microprocessor, that communicates with the DRAM 708 over a bus 720. It must be noted that the bus 720 may be a series of buses and bridges commonly used in a processor-based system, but for convenience purposes only, the bus 720 has been illustrated as a single bus. An input/output (I/O) device 706 may also be connected to the bus 720, but is not necessary to practice the invention. The processor-based system 700 also includes a read-only memory (ROM) 710 and may include peripheral devices such as a floppy disk drive 712 and a compact disk (CD) ROM drive 714 that also communicates with the CPU 702 over the bus 720 as is well known in the art.

The present invention provides a DRAM having a refresh system wherein internally generated refresh operations are performed on a periodic basis while avoiding conflicts with controller-generated data accesses.

The present invention has many possible implementations that would not change the scope of the invention. For example, although the read and/or write access commands are depicted as being allowed only on every fourth clock cycle, the exact number is, of course, not critical. The number of clock cycles is a function of the time required to perform the refresh operation and the frequency of the DRAM clock. For purposes of describing the present invention, the refresh operation was assumed to require four clock cycles. In addition, it should also be appreciated that the refresh operation may be triggered by any portion of the DRAM clock without deviating from the present invention. Furthermore, the block diagram of FIG. 2 is intended to be a representative hardware configuration for describing the invention; and, therefore, the components used and/or the manner in which they are configured is not critical.

Therefore, while the invention has been described in detail in connection with a preferred embodiment known at the time, it should be readily understood that the invention is not limited to such disclosed embodiment. Rather, the invention can be modified to incorporate any number of variations, alterations, substitutions or equivalent arrangements not heretofore described, but which are commensurate with the spirit and scope of the invention. Accordingly, the invention is not to be seen as limited by the foregoing description, but is only limited by the scope of the appended claims.

What is claimed as new and desired to be protected by Letters Patent of the United States is:

1. A method for refreshing memory cells, comprising:
   determining that a data access command has been applied to a command/address bus at a first predetermined time slot for applying data access commands;
   determining that said data access command conflicts with a refresh;
   completing a first data access commanded by said conflicting data access command;
   waiting for a next available time slot during which said refresh may be initiated;
   determining whether a second data access command has been applied to said command/address bus at a second predetermined time slot for applying data access commands; and
   initiating said refresh during said next available time period and prior to reaching a third predetermined time slot for applying data access commands without conflicting with a second data access commanded by said second data access command.

2. The method of claim 1 further comprising:
   determining that said second data access command does not conflict with said refresh; and
   performing said refresh during said next available time slot.

3. The method of claim 1 further comprising:
   determining that said second data access command conflicts with said refresh;
   completing a second data access that conflicts with said refresh;
   waiting for another next available time slot during which said refresh may be initiated; and
   initiating said refresh during said another next available time period without conflicting with a third data access command.

4. The method of claim 3 further comprising:
   completing said second data access that conflicts with said refresh with a memory source other than said memory cells such that said memory cells can be refreshed; and
   performing said refresh on said memory cells.

5. The method of claim 4, wherein said act of completing comprises completing said second data access that conflicts with said refresh with a static random access memory cache.

6. A system for refreshing memory cells of a dynamic random access memory (DRAM) comprising:
   a memory array containing said memory cells;
   a second memory source other than said memory cells;
   a communication link for respectively delivering data access commands to said DRAM on a plurality of predetermined time slots, said plurality of predetermined time slots defining the only time slots on said communication link during which said data access commands may be placed on said communication link; and
   a controller for operating said memory array in accordance with said data access commands, wherein
   said controller is configured to initiate a refresh at a predetermined time and without delaying a data access triggered by a data access command, and wherein
   said controller operates said DRAM such that a conflicting data access command is satisfied with said second memory source other than said memory cells and wherein said memory cells may be refreshed.

7. The system of claim 6, wherein said communication link comprises a command/address bus.

8. The system of claim 6, wherein said memory source other than said memory cells comprises a static random access memory (SRAM) cache.

9. The system of claim 6, wherein said controller comprises a refresh controller.

10. The system of claim 6 further comprising:
    a counter for counting clock cycles of a dynamic random access memory (DRAM) input clock, wherein at least some of said clock cycles define said predetermined time.

11. The system of claim 6, wherein said predetermined time is defined by receiving a predetermined edge of a data access command.

12. The system of claim 11, wherein said predetermined edge is defined as every fourth positive edge of a dynamic random access memory (DRAM) input clock.

13. The system of claim 12, wherein said DRAM input clock has a frequency of approximately 300 MHz.

14. The system of claim 6, wherein said communication link comprises a link for communicating read and/or write commands to said memory array.

15. A memory device, comprising:
    a memory controller configured to operate said memory device to:
    determine that a data access command has been applied to a command/address bus at a first predetermined time slot for applying data access commands;
    determine that said data access command conflicts with a refresh;
    complete a first data access commanded by said conflicting data access command;
    wait for a next available time slot during which said refresh may be initiated;
    determine whether a second data access command has been applied to said command/address bus at a second predetermined time slot for applying data access commands; and
    initiate said refresh during said next available time period and prior to reaching a third predetermined time slot for applying data access commands without conflicting with a second data access commanded by said second data access command.

16. The memory device of claim 15, wherein said memory controller further operates said memory device to:
    determine that said second data access command does not conflict with said refresh; and
    perform said refresh during said next available time slot.

17. The memory device of claim 15, wherein said memory controller further operates said memory device to:
    determine that said second data access command conflicts with said refresh;
    complete a second data access that conflicts with said refresh;
    wait for another next available time slot during which said refresh may be initiated; and initiate said refresh during said another next available time period without conflicting with a third data access command.

18. The memory device of claim 17, wherein said memory controller further operates said memory device to:
complete said second data access that conflicts with said refresh with a memory source other than said memory cells such that said memory cells can be refreshed; and
perform said refresh on said memory cells.

19. The memory device of claim 18, wherein said memory controller further operates said memory device to complete said second data access that conflicts with said refresh with a static random access memory cache.

20. A processor-based system, comprising:
a processor; and
a dynamic random access memory (DRAM) coupled to said processor, said dynamic random access memory having a system for refreshing memory cells in said dynamic random access memory, said system comprising:
a memory array containing said memory cells;
a second memory source other than said memory cells;
a communication link for respectively delivering data access commands to said DRAM on a plurality of predetermined time slots, said plurality of predetermined time slots defining the only time slots on said communication link during which said data access commands may be placed on said communication link; and
a controller for operating said memory array in accordance with said data access commands, wherein
said controller is configured to initiate a refresh at a predetermined time and without delaying a data access triggered by a data access command, and wherein said controller operates said DRAM such that a conflicting data access command is satisfied with said second memory source other than said memory cells and wherein said memory cells may be refreshed.

21. The processor-based system of claim 20, wherein said communication link comprises a command/address bus.

22. The processor-based system of claim 20, wherein said memory source other than said memory cells comprises a static random access memory (SRAM) cache.

23. The processor-based system of claim 20, wherein said controller comprises a refresh controller.

24. The processor-based system of claim 20, wherein said system for refreshing memory cells further comprises:
a counter for counting clock cycles of a dynamic random access memory (DRAM) input clock, wherein at least some of said clock cycles define said predetermined time.

25. The processor-based system of claim 20, wherein said predetermined time is defined by receiving a predetermined edge of a data access command.

26. The processor-based system of claim 25, wherein said predetermined edge is defined as every fourth positive edge of a dynamic random access memory (DRAM) input clock.

27. The processor-based system of claim 26, wherein said DRAM input clock has a frequency of approximately 300 MHz.

28. The processor-based system of claim 20, wherein said communication link comprises a link for communicating read and/or write commands to said memory array.

* * * * *